US009460248B2

(12) United States Patent
Ahn et al.

(10) Patent No.: US 9,460,248 B2
(45) Date of Patent: Oct. 4, 2016

(54) METHOD FOR PREDICTING DEGREE OF CONTAMINATION OF MOLTEN STEEL DURING LADLE EXCHANGE

(71) Applicant: Hyundai Steel Company, Incheon (KR)

(72) Inventors: Jae Hwan Ahn, Chuncheongnampdo (KR); Kyung Soo Kim, Seoul (KR); Hong Kil Moon, Chuncheongnam-Do (KR)

(73) Assignee: Hyundai Steel Company, Dong-gu (KR)

(*) Notice: Subject to any disclaimer, the term of this patent is extended or adjusted under 35 U.S.C. 154(b) by 652 days.

(21) Appl. No.: 13/778,933

(22) Filed: Feb. 27, 2013

(65) Prior Publication Data
US 2013/0197885 A1 Aug. 1, 2013

Related U.S. Application Data

(63) Continuation of application No. PCT/KR2011/006422, filed on Aug. 30, 2011.

(30) Foreign Application Priority Data

Aug. 30, 2010 (KR) .................. 10-2010-0084133
Aug. 29, 2011 (KR) .................. 10-2011-0086293

(51) Int. Cl.
*B22D 11/16* (2006.01)
*C21C 1/04* (2006.01)
(Continued)

(52) U.S. Cl.
CPC .......... *G06F 17/5018* (2013.01); *B22D 1/00* (2013.01); *B22D 11/16* (2013.01); *B22D 11/181* (2013.01); *C21C 1/04* (2013.01); *Y02P 10/286* (2015.11)

(58) Field of Classification Search
CPC ... B22D 11/183; B22D 11/203; B22D 11/16; B22D 11/181; C21B 2300/04; C21C 2300/06; C21C 1/04; Y02P 10/286
See application file for complete search history.

(56) References Cited

U.S. PATENT DOCUMENTS 110,990 A * 1/1871 Middleton ............ C21C 5/4673
266/223
3,439,759 A * 4/1969 Rouanet ................ B22D 11/18
137/408

(Continued)

FOREIGN PATENT DOCUMENTS

JP 06-007904 A 1/1994
JP 08-267219 A 10/1996
(Continued)

OTHER PUBLICATIONS

Numerical simulation of the transient fluid flow in the tundish of a continuous caster; H.-J. Odenthal et al; 2002; pp. 1-9 (10 Pages total) presented at 5th World Congress on Computational Mechanics, Wien, 7.-Dec. 7, 2002, http://wccm.tuwien.ac.at.*

*Primary Examiner* — Akash Saxena
(74) *Attorney, Agent, or Firm* — Locke Lord LLP; Howard M. Gitten

(57) ABSTRACT

Predicting a degree of molten steel contamination during ladle exchange includes setting a casting quantity (Q) and a residual quantity (Qrm). Casting quantity (Q) is the molten steel amount transferred from a tundish to a mold when a first ladle operation ends. Residual quantity (Qrm) is the molten steel amount existing in the tundish when a second ladle starts. Casting amount (Qplug), a first contaminant concentration is calculated as a function of $Q_{rm}$ and a proportional coefficient. Casting amount (Qpeak), the amount a second contaminant concentration, is calculated as a function of $Q_{rm}$ and a second proportional coefficient. A preliminary degree of contamination is a linear function of Q, Qplug, and Qpeak. A second preliminary degree of contamination is an exponential function of Q, Qplug, and Qpeak. The smaller of the two preliminary degrees of contamination is selected to obtain a degree of contamination at the ladle operation end and a second degree of contamination at the second ladle operation start.

7 Claims, 8 Drawing Sheets

(51) Int. Cl.
  *G06F 17/50* (2006.01)
  *B22D 1/00* (2006.01)
  *B22D 11/18* (2006.01)

(56) References Cited

U.S. PATENT DOCUMENTS

| | | | | |
|---|---|---|---|---|
| 3,537,505 A | * | 11/1970 | Moser | B22D 11/148 164/263 |
| 3,663,204 A | * | 5/1972 | Jungwirth | C21C 7/10 266/210 |
| 4,333,512 A | * | 6/1982 | Sugiura | G01N 33/20 164/151.4 |
| 4,460,031 A | * | 7/1984 | Wiesinger | B22D 11/181 164/151.3 |
| 4,600,047 A | * | 7/1986 | Matoba | B22D 11/204 164/452 |
| 4,976,780 A | * | 12/1990 | Amano | C21B 5/006 266/80 |
| 5,174,361 A | * | 12/1992 | Kursfeld | B22D 11/161 164/155.7 |
| 5,203,909 A | * | 4/1993 | Petrushka | B22D 43/001 266/227 |
| 5,633,462 A | * | 5/1997 | Heaslip | G01F 1/666 164/150.1 |
| 5,727,127 A | * | 3/1998 | Schulze Horn | B22D 11/16 706/47 |
| 5,884,685 A | * | 3/1999 | Umezawa | B22D 11/16 164/150.1 |
| 6,197,086 B1 | * | 3/2001 | Stofanak | B22D 2/001 266/93 |
| 6,921,425 B2 | * | 7/2005 | Blejde | B22D 1/00 266/79 |
| 8,006,743 B2 | * | 8/2011 | Weyer | B22D 11/16 164/154.1 |
| 2007/0256518 A1 | * | 11/2007 | Dry | C21B 3/04 75/401 |
| 2008/0173423 A1 | * | 7/2008 | Hohenbichler | B22D 11/103 164/453 |
| 2009/0138223 A1 | * | 5/2009 | Kim | B22D 11/16 702/81 |
| 2011/0174457 A1 | * | 7/2011 | Abraham | B22D 11/16 164/4.1 |
| 2013/0197885 A1 | * | 8/2013 | Ahn | G06F 17/5018 703/2 |
| 2015/0190863 A1 | * | 7/2015 | Tang | B22D 11/18 164/453 |
| 2015/0204837 A1 | * | 7/2015 | Han | B22D 11/16 702/182 |
| 2015/0298204 A1 | * | 10/2015 | Nakaoka | B22D 11/041 164/452 |

FOREIGN PATENT DOCUMENTS

| | | |
|---|---|---|
| JP | 08-290259 A | 11/1996 |
| JP | 3337692 B2 | 8/2002 |

* cited by examiner

METHOD FOR PREDICTING DEGREE OF CONTAMINATION OF MOLTEN STEEL DURING LADLE EXCHANGE

CROSS-REFERENCE TO RELATED APPLICATION

This is a continuation of International Application No. PCT/KR2011/006422 filed on Aug. 30, 2011, which claims priority to Korean Application No. 2010-10-0084133 filed on Aug. 30, 2010 and Korean Application No. 2011-10-0086293 filed on Aug. 29, 2011, which applications are incorporated herein by reference.

TECHNICAL FIELD

The present invention relates to a method for predicting the degree of contamination of molten steel in a tundish during ladle exchange.

BACKGROUND ART

Generally, a continuous casting machine is a system that produces cast steel having a specific size by supplying molten steel, produced in a steel-making furnace, to a continuous casting mold through a ladle unit and a tundish.

The continuous casting machine comprises a ladle unit for storing molten steel, a tundish, a continuous casting mold for cooling the molten steel discharged from the tundish to form continuously cast steel having a specific shape, and a plurality of pinch rolls connected to the mold and serving to move the continuously cast steel formed in the mold.

In other words, molten steel discharged from the ladle unit and the tundish is formed into continuously cast steel having a specific width and shape in the mold, and the continuously cast steel is transferred through the pinch rolls and cut by a cutter into slabs, blooms or billets having a specific shape.

The ladle unit consists of a plurality of ladles, and after molten steel in the first ladle has been completely supplied to the tundish, molten steel in the second ladle is supplied to the tundish.

SUMMARY

It is an object of the present invention to provide a method for predicting the degree of contamination of molten steel during ladle exchange, in which the degree and range of contamination of molten steel at the end of an operation of a first ladle and the start of an operation of a second ladle are predicted and analyzed according to operating variables.

The objects of the present invention are not limited to the above-mentioned objects, and other objects of the present invention will be clearly understood by those skilled in the art to which the present invention pertains.

In order to accomplish the above object, the present invention provides a method for predicting the degree of contamination of molten steel, the method comprising the steps of: (1) setting a casting quantity (Q) and a residual quantity of residual molten steel (Qrm), wherein the casting quantity (Q) is defined as the amount of molten steel transferred from a tundish to a mold at the end of an operation of a first ladle and the residual quantity (Qrm) is defined as the amount of molten steel existing in the tundish at the start of an operation of a second ladle; (2) calculating, based upon the Qrm with a first proportional coefficient (g) or a second proportional coefficient (h), a casting amount (Qplug) which is the casting amount when concentration of contaminants is a first reference value and a casting amount (Qpeak) which is the casting amount when concentration of contaminants is a second reference value; (3) determining a first preliminary degree of contamination from a linear function with the Q, Qplug, and Qpeak and a second preliminary degree of contamination from an exponential function with the Q, Qplug, and Qpeak; and (4) selecting the smaller of the first and second preliminary degrees of contamination to obtain a first degree of contamination at the end of the operation of the first ladle and a second degree of contamination at the start of the operation of the second ladle.

In step (2) of the method of the present invention, the first reference value is 0.01, and the second reference value is a value when the concentration of contaminants is the maximum. Also, the Qplug is obtained by multiplying the Qrm by the first proportional coefficient (g), and the Qpeak is obtained by multiplying the Qrm by the second proportional coefficient (h). Further, the first proportional coefficient (g) is 0~0.3, and the second proportional coefficient (h) is 0.1~0.4.

In addition, in step (4), a total degree (Tc) of contamination is obtained based on the first and second degrees of contamination. Additionally, the method of the present invention further comprises, in step (4), a step of selecting the greater of the selected smaller and zero to obtain the first degree of contamination or the second degree of contamination.

According to the present invention, the degrees of contamination of molten steel at the end of an operation of the first ladle and the start of an operation of the second ladle are predicted and analyzed according to operating variables, making it possible to predict the time point of an occurrence of contamination of continuously cast steel, which best indicates the defective rate of the cast steel. In addition, the chance of inferior quality cast steel being produced can be minimized or eliminated by controlling the source of contamination at the start of an operation of the second ladle.

DESCRIPTION OF THE REFERENCE NUMERALS IN THE DRAWINGS

Figure 1:
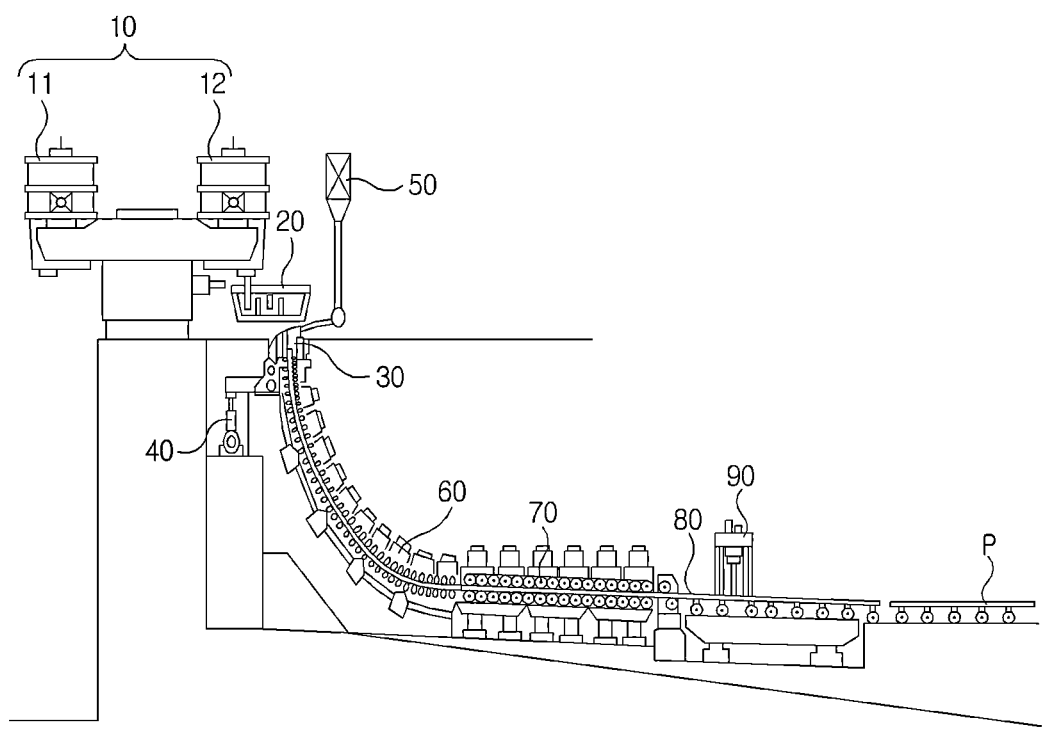
FIG. 1 is a side view of a continuous casting machine related to an embodiment of the present invention.

10: ladle unit; 11: first ladle;
12: second ladle; 15: shroud nozzle;
20: tundish; 25: submerged entry nozzle;
30: mold; 40: mold oscillator;
50: powder feeder; 51: powder layer;
52: liquid flow layer; 53: lubricating layer;
60: support rolls; 65: spray;

70: pinch rolls; 80: continuously cast steel;
81: solidified shell; 82: non-solidified molten steel;
83: end; 85: point of completion of solidification.

DETAILED DESCRIPTION

Hereinafter, preferred embodiments of the present invention will be described in further detail with reference to the accompanying drawings. In the following description, the same elements will be indicated by the same reference numerals wherever possible, even if they are shown in different drawings. Further, the detailed description of known functions and configurations will be omitted when it may obscure the subject matter of the present invention.

FIG. 1 is a side view of a continuous casting machine related to one embodiment of the present invention.

Referring to FIG. 1, the continuous casting machine may comprise a tundish 20, a mold 30, secondary cooling zones 60 and 65, pinch rolls 70, and a cutter 90.

The tundish 20 is a container that receives molten steel from a ladle unit 10 and supplies the molten steel to the mold 30. The ladle unit 10 is composed of a pair of ladles: a first ladle 11 and a second ladle 12. The ladles 11 and 12 alternately receive the molten steel and alternately supply the molten steel to the tundish 20. In the tundish 20, there are performed the control of feed rate of the molten steel into the mold 30, the distribution of the molten steel to each mold 30, the storage of the molten steel, and the separation of slag and non-metal inclusions, etc.

The mold 30 is generally a water-cooled mold made of copper, in which the molten steel is primarily cooled. The mold 30 has a structure in which a pair of opposite faces are spaced apart from each other and provide a cavity in which the molten steel is received. Where a slab is to be produced, the mold 30 comprises a pair of long walls and a pair of short walls connecting the long walls with each other. Herein, the long walls have an area smaller than the short walls. The walls (mainly short walls) of the mold 30 are tapered to each other such that they are distant from each other or close to each other. This taper is set in order to compensate for shrinkage caused by the solidification of the molten steel (M) in the mold 30. The degree of solidification of the molten steel (M) varies depending on the carbon content of the steel, the type of powder (fast cooling type or slow cooling type), casting speed, etc.

The mold 30 functions to form a strong solidified shell 81 (see FIG. 2) such that a continuously cast steel drawn from the mold maintains its shape and non-solidified molten steel does not flow out. Water cooling structures for use in the mold include a structure employing a copper tube, a structure having a water cooling groove formed in a copper block, a structure employing a copper tube assembly having a water cooling groove.

The mold 30 is oscillated by an oscillator 40 in order to prevent molten steel from adhering to the wall surface of the mold. A lubricant is used to reduce the friction between the mold 30 and the continuously cast steel during oscillation. Examples of the lubricant include rape oil, which is sprayed, and powder, which is added to the surface of molten steel in the mold 30. The powder is added to molten steel in the mold 30 to form slag and functions to provide lubrication between the mold 30 and the continuously cast steel and to prevent the oxidation and nitrification of molten steel in the mold 30, and also to keep the molten steel warm. In addition, it functions to absorb non-metal inclusions on the surface of molten steel. A powder feeder 50 is provided in order to introduce the powder into the mold 30. The portion of the powder feeder 50 that discharges the powder is directed toward the inlet of the mold 30.

The secondary cooling zones 60 and 65 serve to additionally cool the molten steel primarily cooled in the mold 30. The primarily cooled molten steel is cooled directly by water spray means 65 while it is supported by support rolls 60 such that the solidified shell is not deformed.

The solidification of the continuously cast steel is mostly achieved by the secondary cooling. A drawing device adopts a multi-drive method that uses several sets of pinch rolls 70 so as to draw the continuously cast steel without sliding. The pinch rolls 70 pull the solidified end of the molten steel in the casting direction so that the molten steel that passed through the mold 30 can continuously move in the casting direction.

The cutter 90 is provided so as to cut the continuously cast steel into a constant size. The cutter 90 may be a gas torch or a hydraulic shear.

Figure 2:
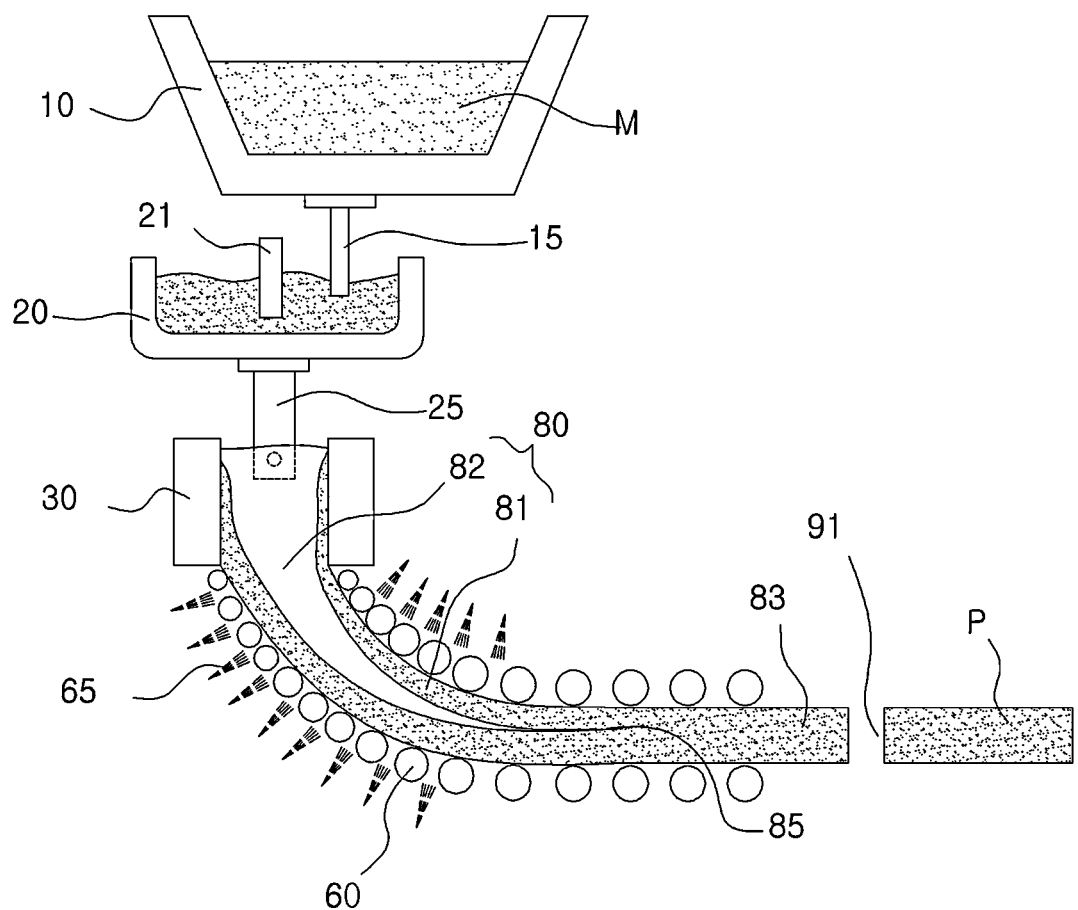
FIG. 2 is a conceptual view explaining the continuous casting machine of FIG. 1 with respect to the flow of molten steel M.

FIG. 2 is a conceptual view explaining the continuous casting machine of FIG. 1 with respect to the flow of molten steel M.

Referring to FIG. 2, molten steel M in the ladle unit 10 flows into the tundish 20. To perform this flow process, the ladle unit 10 is provided with a shroud nozzle 15 extending toward the tundish 20. The shroud nozzle 15 extends to submerge into the molten steel M in the tundish 20 so as to prevent the molten steel M from being oxidized and nitrified by exposure to air. Exposure of the molten steel M to air due to the breakage of the shroud nozzle 15 is called "open casting".

The molten steel M in the tundish 20 flows into the mold 30 through a submerged entry nozzle 25 extending into the mold 30. The submerged entry nozzle 25 is disposed at the center of the mold 30 so that the flows of the molten steel M discharged from both outlets of the submerged entry nozzle 25 are symmetrical. The commencement of discharge of the molten steel M from the submerged entry nozzle 25, the discharge speed and the cessation of the discharge are determined by a stopper 21 that is disposed in the tundish 20 so as to correspond to the submerged entry nozzle 25. Specifically, the stopper 21 can move vertically along the same line as the submerged entry nozzle 25 so as to open and close the inlet of the submerged entry nozzle 25. The flow of the molten steel M through the submerged entry nozzle 25 can be controlled by a slide gate method different from a stopper method. In the slide gate method, a plate slides horizontally in the tundish 20 to control the discharge flow rate of the molten steel M through the submerged entry nozzle 25.

The molten steel M in the mold 30 starts to solidify from the peripheral portion of the molten steel M, which comes into contact with the inner walls of the mold 30. This is because the peripheral portion of the molten steel M is more likely to lose heat by the mold 30 being cooled by water compared to the central portion. Because the peripheral portion is solidified first, the downward portion of the continuously cast steel 80 in the casting direction is in a form in which the non-solidified molten steel 82 is surrounded by the solidified shell 81.

As the pinch rolls 70 (FIG. 1) pull the end 83 of the completely solidified, continuously cast steel 80, the non-solidified molten steel 82 together with the solidified shell 81 moves in the casting direction. In the movement process, the non-solidified molten steel 82 is cooled by spray means 65 that spray cooling water. This gradually reduces the thickness of the non-solidified molten steel 82 in the continuously cast steel 80. When the continuously cast steel 80 reaches a point 85, the entire thickness thereof is composed of the solidified shell 81. The completely solidified continuously cast steel 80 is then cut into specific sizes in a cutting place 91 to form pieces P such as slabs.

Figure 3:
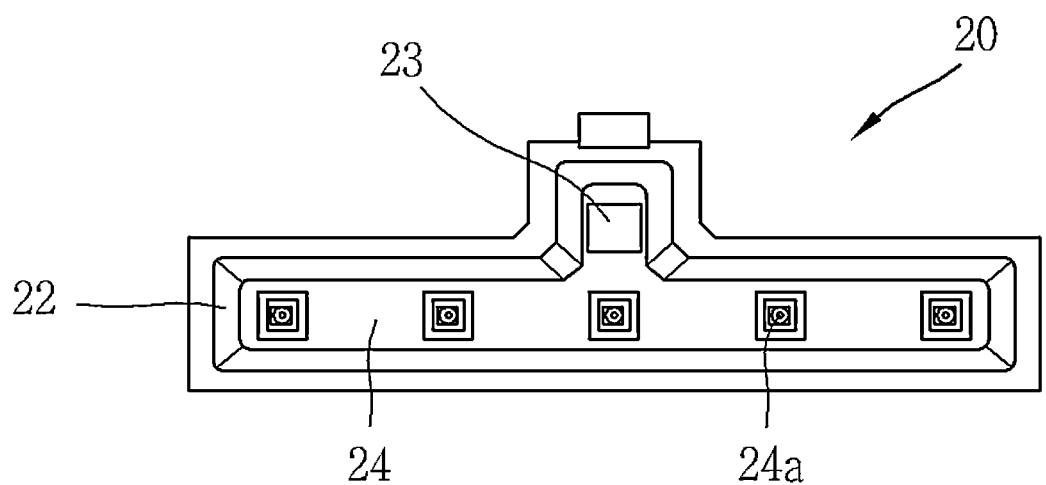
FIG. 3 is a top view of the tundish shown in FIG. 2.

FIG. 3 is a top view of the tundish shown in FIG. 2.

Referring to FIG. 3, the tundish 20 has a body 22 that is open at the upper end in order to receive the molten steel M discharged from the ladle unit 10. The body 22 may comprise an outer iron shell and a refractory layer disposed inside the iron shell.

Although the body 22 may have various shapes, for example, a straight line shape, this embodiment illustrates a T-shaped body 22.

At a portion of the body 22, there is formed a pouring portion 23. The pouring portion 23 is a portion into which the molten metal M flowing through the shroud nozzle 15 of the ladle unit 10 drops. The pouring portion 23 can communicate with a tapping portion 24 having a larger area.

The tapping portion 24 is a portion that guides the molten steel M, received in the pouring portion 23, to the mold. The tapping portion 24 may have a plurality of tapping holes 24a. Each of the tapping holes 24a is connected to the submerged entry nozzle 25 which guides the molten steel M in the tundish 20 to the mold 30.

Figure 4:
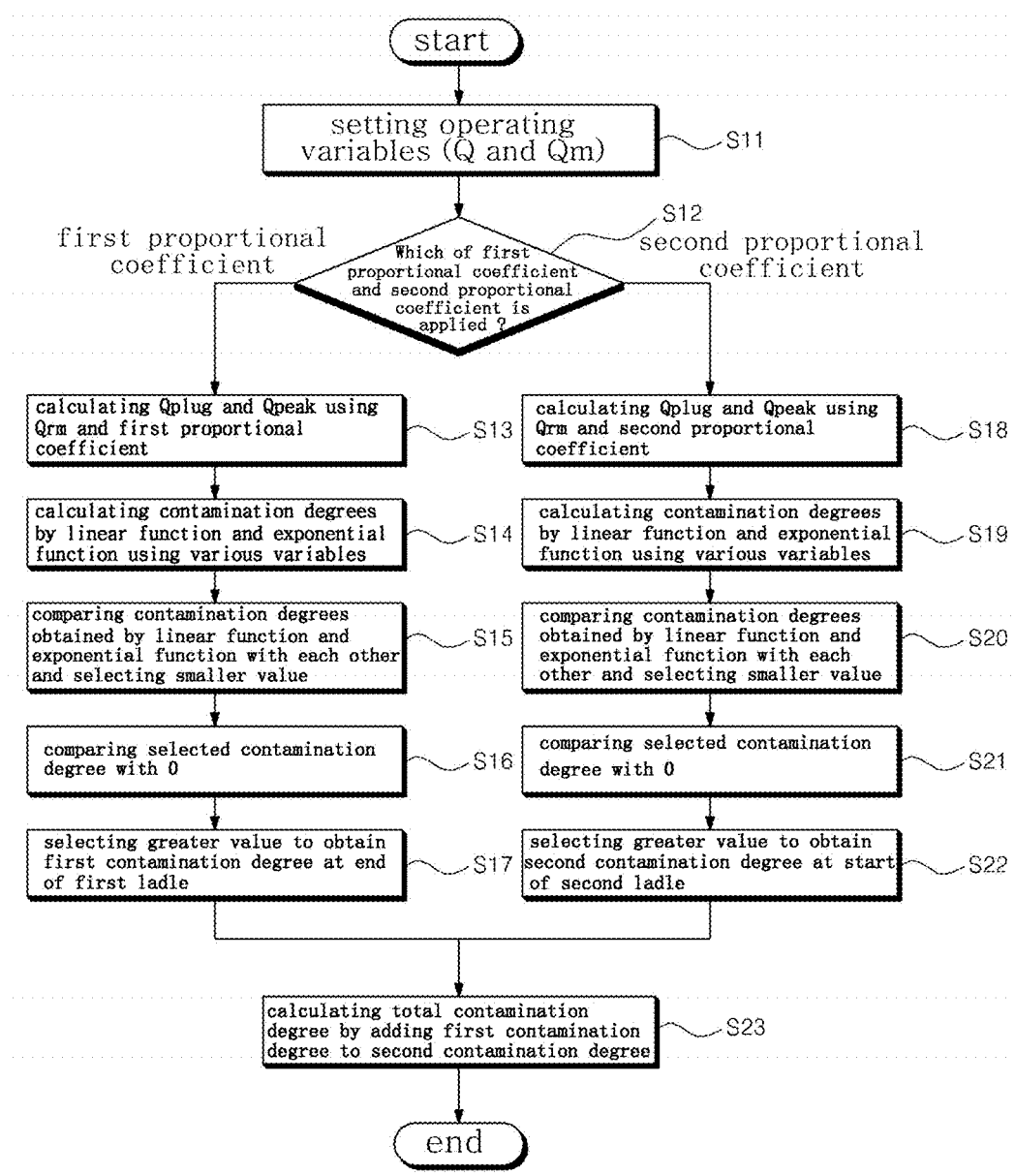
FIG. 4 is a flow chart showing a process for predicting the contamination of molten steel in a tundish according to one embodiment of the present invention.

FIG. 4 is a flow chart showing a process for predicting the contamination degree of molten steel in a tundish according to an embodiment of the present invention. The process for predicting the contamination of molten steel will now be described with reference to the accompanying drawings.

During exchange of the ladle unit 10, molten steel is significantly contaminated at the end of an operation of the first ladle 11 and the start of an operation of the second ladle 12.

Figure 5:
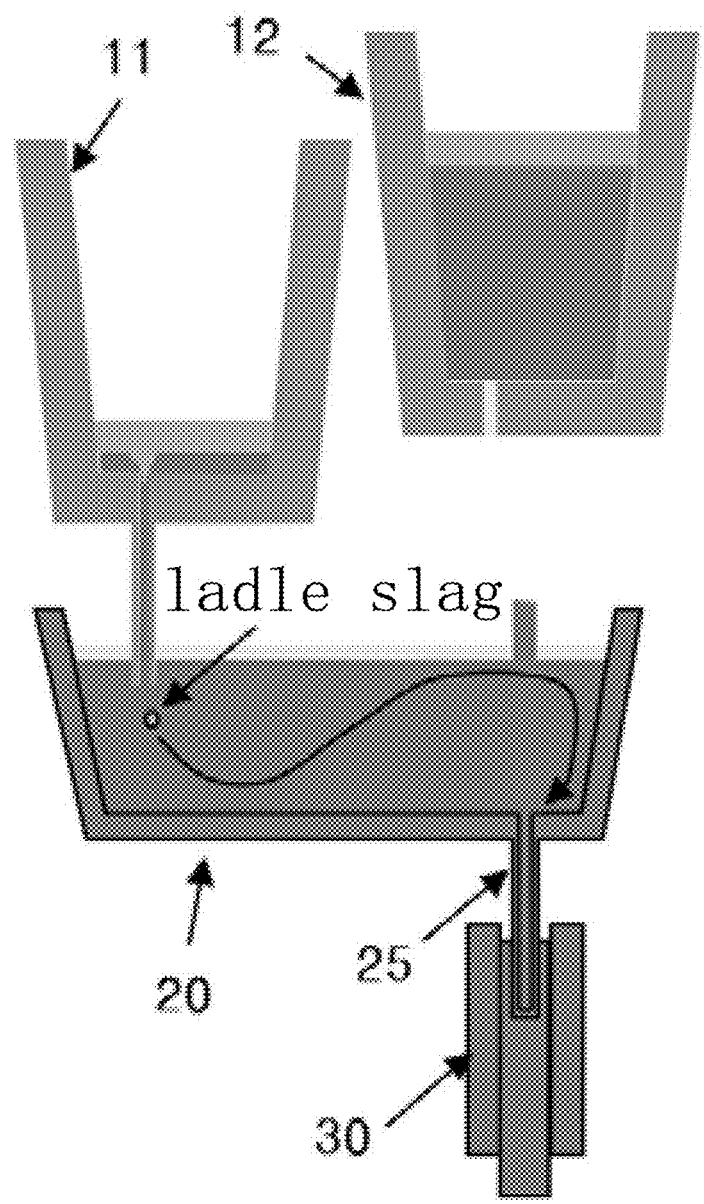
FIG. 5 shows circumstances at the end of an operation of a first ladle.

As shown in FIG. 5, at the end of an operation of the first ladle 11, slag in the ladle is fed into the mold through the tundish. Thus, the defective rate of the cast steel is increased at the end of the operation of the ladle.

Figure 6:
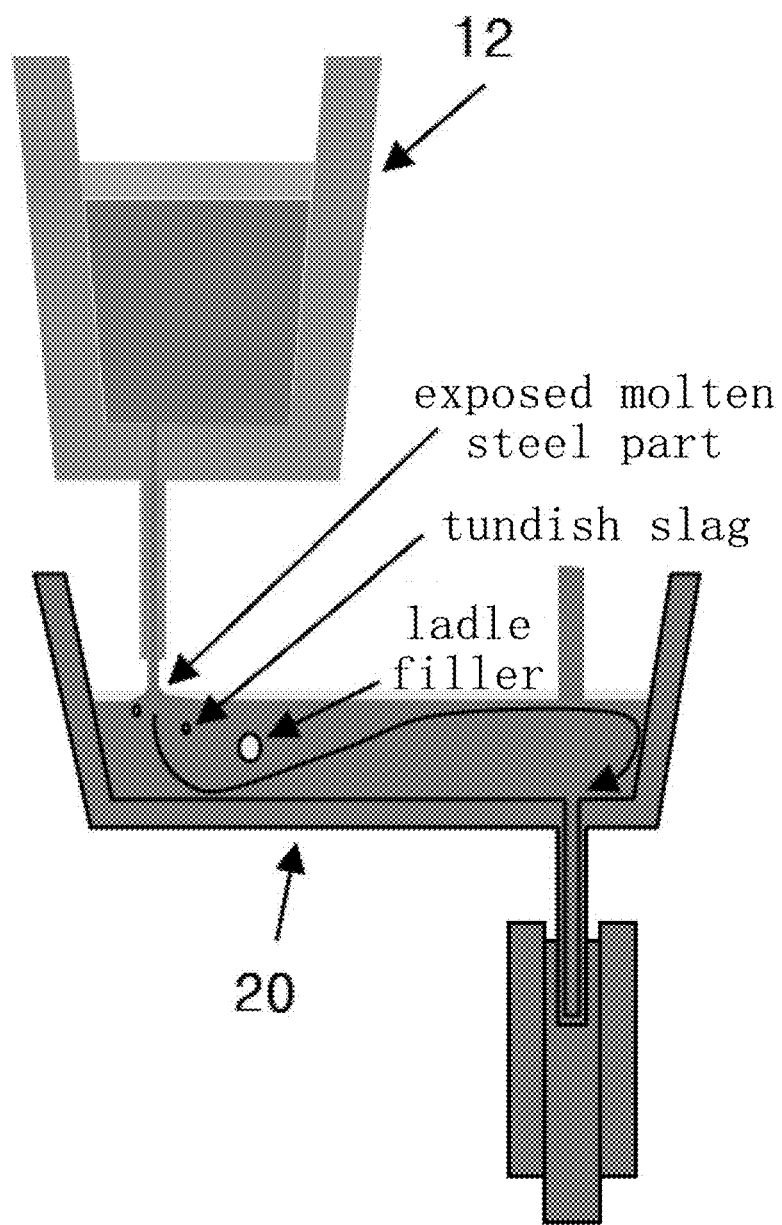
FIG. 6 shows circumstances at the start of an operation of a second ladle.

As shown in FIG. 6, at the start of an operation of the second ladle 12, filler in the second ladle 12 is incorporated into molten steel, or the level of the molten steel in the tundish 20 becomes temporarily lower than the shroud nozzle 15, causing part of the molten steel in the tundish 20 to become exposed, and thus the molten steel is re-oxidized or slag in the tundish 20 is incorporated into the mold. Due to this problem, the defective rate of the cast steel is increased.

Thus, the quantitative evaluation of the range of contamination of molten steel and the prediction of the degree of contamination of molten steel during ladle exchange are required.

Figure 7:
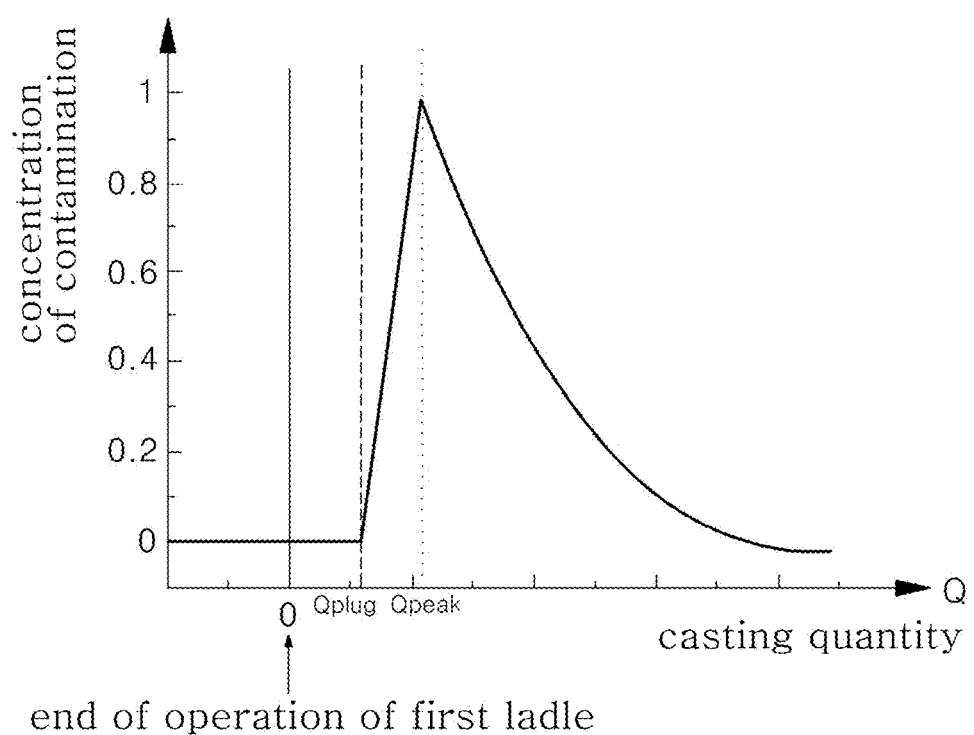
FIGS. 7 and 8 show the degree of contamination of molten steel during ladle exchange.

The degree of contamination of molten steel was analyzed using a water model, and the results of the analysis are shown in FIG. 7. As can be seen therein, at the end of an operation of the first ladle 11 or the start of an operation of the second ladle 12, the degree of contamination of molten steel increases linearly with time (quantity of casting), and after the degree of contamination has reached the peak value, it decreases exponentially. In other words, the concentration of contaminants during ladle exchange increases linearly to 1 until the quantity of casting reaches Qpeak from Qplug, and then it decreases exponentially to approach 0. The results in FIG. 7 are those obtained by analyzing the degree of contamination of molten steel in the inlet side of the mold under various conditions, the molten steel having been poured into the mold 30 from the tundish 20 through the submerged entry nozzle 25, and then graphically expressing the analysis results.

Hereinafter, a description will be given of the process for determining the degree of contamination of molten steel at the end of operation of the first ladle 11, which occurs under the circumstances shown in FIG. 5, and the degree of contamination of molten steel at the start of an operation of the second ladle 12, which occurs under the circumstances shown in FIG. 6.

First, the process for determining the degree of contamination of molten steel at the end of an operation of the first ladle 11 will be explained. As shown in FIG. 4, operating variables, including casting quantity (Q), that is, the quantity of molten steel flowing into the mold through the tundish after the end of an operation of the first ladle 11, and the quantity of residual molten steel (Qrm) remaining in the tundish at the start of an operation of the second ladle 12 as shown in FIG. 6, are set and input into a contamination prediction system (not shown) by the user (S11). The quantity of residual molten steel (Qrm) can be determined by subtracting the intrinsic weight of the tundish 20 from the total weight of the tundish 20 and molten steel at the start of an operation of the second ladle 12. Although not shown in the figures, the contamination prediction system may be composed of a computer comprising: an input means for inputting various variables and parameters; a control unit for calculating the degree of contamination according to arithmetic algorithms stored in a memory, and various variables and parameters; and a display unit for numerically or graphically displaying the calculated contamination degree by the control unit.

Then, using the quantity of residual molten steel (Qrm) remaining in the tundish at the start of the operation of the second ladle 12 and a set first proportional coefficient, the contamination prediction system calculates the casting quantity (Qplug) when the concentration of contaminants after the end of the operation of the first ladle 11 becomes a set first reference value, and the casting amount (Qplug) when the concentration of contaminants becomes a set second reference value, by the following equation 1 (S12 and S13):

$$Q_{plug} = g \times Q_{rm}$$

$$Q_{peak} = h \times Q_{rm} \qquad \text{Equation 1}$$

wherein Qrm is the quantity (ton) of residual molten steel remaining in the tundish at the start of the operation of the second ladle, Qplug is the casting quantity (ton) when the concentration of contaminants after the end of the operation of the first ladle becomes 0.01, Qpeak is the casting quantity when the concentration of contaminants becomes 1, g is a first proportional coefficient, and h is a second proportional coefficient.

For example, in FIG. 7, the lowest concentration of contaminants is 0, and the highest concentration of contaminants is 1. The casting quantity when the concentration of contaminants after the end of the operation of the first ladle 11 becomes 0.01 is defined as Qplug. Qplug refers to the casting quantity required for ladle slag introduced from the ladle to be introduced from the tundish 20 into the mold through the shortest pathway and is proportional to the quantity of residual molten steel (Qrm) in the tundish at the time point of introduction. The first proportional coefficient (g) is a measure indicating the plug flow property of molten steel in the tundish 20 and may have a value between 0 and 0.2 depending on the shape of the tundish 20, that is, the plug flow property.

In addition, Qpeak refers to the casting amount when the concentration of contaminants is 1. The Qpeak value is determined by the flow property of molten steel in the tundish 20 and is proportional to the quantity of residual molten steel (Qrm) in the tundish at the time point of introduction, and the second proportion coefficient (h) may have a value between 0.1 and 0.3.

After each of Qplug and Qpeak has been calculated as described above, the degrees of contamination according to exponential function and linear function are calculated based on Qplug, Qpeak and set values.

The linear function and the exponential function are shown in the following equations 2 and 3 (S14):

$$\frac{(Q - Q_{plug})}{(Q_{peak} - Q_{plug})} \quad \text{Equation 2}$$

wherein Q is the casting quantity (ton) after the end of an operation of the first ladle, Qrm is the quantity of residual molten steel (ton) remaining in the tundish at the start of an operation of the second ladle, Qplug is the casting amount when the concentration of contaminants after the end of the operation of the first ladle becomes 0.01, and Qpeak is the casting amount when the concentration of contaminants is 1.

$$\exp\left(-f \cdot \left(\frac{Q}{Q_{rm}} - Q_{peak}\right)\right) \quad \text{Equation 3}$$

wherein f is a third proportional coefficient.

As shown in FIG. 7, the concentration of contamination with ladle slag increases linearly to 1 until the casting quantity increases from Qplug to Qpeak, and then it decreases exponentially to approach 0. Herein, the degree of the exponential decrease is proportional to the ratio (Q/Qrm) between Qrm at the time point when ladle slag flows into the tundish 20 and the casting quantity after the time point, and the third proportional coefficient (f) may have a value between 3 and 8.

Figure 8:
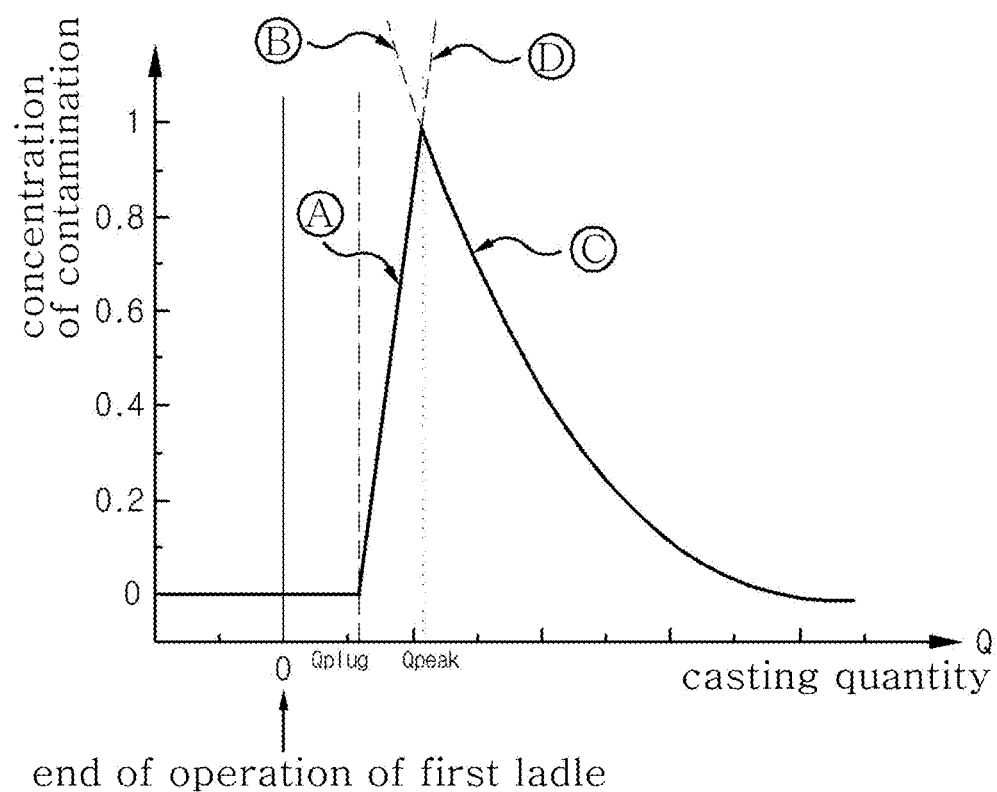

The degrees of contamination obtained by the above linear function and exponential function are compared with each other, and the smaller value among the two values is primarily determined to be the degree of contamination of molten steel at the end of an operation of the first ladle 11 as a function of the casting quantity. The reason why the smaller value among the two is selected is because the degree of contamination between Qplug and Qpeak appears as a linear function (A) in FIG. 8 and the value of the linear function (A) is greater than that of an exponential function (B). Another reason is because the degree of contamination in the region beyond Qpeak appears as an exponential function (C) and the value of the exponential function (C) is greater than that of an exponential function (D).

The above determined contamination degree is compared with 0, and the greater value among the two values is finally determined to be the degree of contamination of molten steel at the end of an operation of the first ladle 11 (S16 and S17). Herein, the reason why the greater value among the two values is selected is because the degree of contamination cannot have a negative (−) value.

The process for determining the degree of contamination of molten steel at the start of an operation of the second ladle 12 will now be explained. The quantity of casting (Q), that is, the quantity of molten steel flowing into the mold through the tundish 20 after the end of an operation of the first ladle 11, and the quantity of residual molten steel (Qrm) remaining in the tundish 20 at the start of operation of the second ladle 12 as shown in FIG. 6, are set and input into a contamination prediction system (not shown) by the user (S11).

Then, using the quantity of residual molten steel (Qrm) at the start of an operation of the second ladle 12 and the set second proportional coefficients (g and h), the contamination prediction system calculates each of the casting quantity (Qplug) when the concentration of contaminants after the end of an operation of the first ladle 11 becomes a set first reference value, and the casting quantity (Qpeak) when the concentration of contaminants becomes a set second reference value (S12 and S18). The second proportional coefficient is the same parameter as the first proportional coefficient and may have a different value.

For example, in FIG. 7, the lowest concentration of contaminants is 0 and the highest concentration of contaminants is 1. The casting quantity when the concentration of contaminants after the end of an operation of the first ladle becomes 0.01 is defined as Qplug, and Qplug can be calculated by the above equation 1 ($Q_{plug} = g \times Q_{rm}$). Qplug refers to the casting quantity required for ladle slag introduced from the ladle to be introduced from the tundish 20 into the mold through the shortest pathway and is proportional to the quantity of residual molten steel (Qrm) in the tundish at the time point of introduction. The first proportional coefficient (g) is a measure indicating the plug flow property of molten steel in the tundish 20 and may have a value between 0.1 and 0.3 depending on the shape of the tundish 20, that is, the plug flow property.

Also, Qpeak refers to the casting quantity when the concentration of contaminants is 1, and Qpeak can be calculated by the above equation 1 ($Q_{peak} = h \times Q_{rm}$). The Qpeak value is determined by the flow property of molten steel in the tundish 20 and is proportional to the quantity of residual molten steel (Qrm) at the time point of introduction, and the second proportional coefficient (h) may have a value between 0.2 and 0.4.

After each of Qplug and Qpeak has been calculated as described above, the degrees of contamination according to a linear function and an exponential function are calculated based on the calculated Qplug and Qpeak and the set values (S19). The linear function and the exponential function are shown in equations 2 and 3 above.

As shown in FIG. 7, the concentration of contaminants by ladle filler, tundish slag and the re-oxidation of molten steel increases linearly to 1 until the casting quantity increases from Qplug to Qpeak, and then it decreases exponentially to approach 0. Herein, the degree of the exponential decrease is proportional to the ratio (Q/Qrm) between Qrm at the time point when ladle slag is introduced and the casting quantity after the time point, and the second proportional coefficient (f) may have a value between 3 and 8. The quantity of residual molten steel (Qrm) in the tundish reaches the minimum quantity immediately before the opening of the second ladle 12 and increases after the opening of the second ladle 12 until the normal quantity of molten steel is reached. A third proportional coefficient (f) increases in the range of 3-8 immediately before the second ladle 12 opens as the amount of molten steel in the tundish decreases, and it increases in the range after the opening of the second ladle 12 as the quantity per minute of molten steel flowing from the second ladle 12 into the tundish increases, until the normal quantity of molten steel is reached.

The degrees of contamination obtained by the linear function and the exponential function are compared with each other, and the smaller value of the two values is primarily determined to be the degree of contamination of molten steel for a specific casting quantity at the start of operation of the second ladle 12 (S20).

Then, the above determined contamination degree is compared with 0, and the greater value among the two values is finally determined to be the degree of contamination of molten steel at the start of the operation of the second ladle 12 (S21 and S22).

As described above, the degree of contamination of molten steel at the end of the operation of the first ladle 11 and the degree of contamination of molten steel at the start of the operation of the second ladle 12 are calculated using the same equations and procedures, except that the first proportional coefficient (g), the second proportional coefficient (h) and the third proportional coefficient (f) differ therebetween.

The overall processes for calculating the degree of contamination of molten steel at the end of the operation of the first ladle 11 (C1) and the degree of contamination of molten steel at the start of the operation of the second ladle (C2) are expressed as equations 4 and 5 below. In other words, in the method for calculating the degrees of contamination of molten steel (C1 and C2), as shown in equations 4 and 5, the determined linear function and exponential function are compared with each other, and the smaller value is selected, after which the selected value is compared with 0, and the greater value is selected and determined to be the degree of contamination for a specific casting quantity (Q).

$$C1 = \text{Max}\left(0, \text{Min}\left((Q - Qplug)/(Qpeak - Qplug), \exp\left(-f \cdot \left(\frac{Q}{Q_{rm}} - Q_{peak}\right)\right)\right)\right) \quad \text{Equation 4}$$

$$C2 = \text{Max}\left(0, \text{Min}\left((Q - Qplug)/(Qpeak - Qplug), \exp\left(-f \cdot \left(\frac{Q}{Q_{rm}} - Q_{peak}\right)\right)\right)\right) \quad \text{Equation 5}$$

Then, as shown in the following equation 6, the contamination prediction system adds the contamination degree at the end of the operation of the first ladle 11 (C1), obtained by applying the first proportional coefficient, to the contamination degree at the start of the operation of the second ladle 12 (C2), obtained by applying the second proportional coefficient, thereby determining the total contamination degree of molten steel (Tc) (S23):

$$Tc = A \times C1(1-A) \times C2 \quad \text{Equation 6}$$

wherein C1 is the degree of contamination at the end of the operation of the first ladle 11, C2 is the degree of contamination at the start of the operation of the second ladle 12, and A is weight.

The weight (A) may be a value between 0.2 and 0.4, preferably about 0.3, because the influence of contamination at the end of the operation of the first ladle 11 is about 30% and the influence of contamination at the start of the operation of the second ladle is about 70%.

Through the process for predicting the degree of contamination as described above, it is possible to predict the time point of occurrence of contamination of continuously cast steel, which best indicates the defective rate of the cast steel according to operating variables (Q and Qrm) and the shape of the tundish 20. Thus, the chance of inferior quality cast steel being produced can be minimized by variably controlling the position at which the continuously cast steel is cut, and the chance of inferior quality cast steel being produced can be minimized or eliminated by controlling the source of contamination at the start of an operation of the second ladle 12.

Although the preferred embodiments of the present invention have been disclosed for illustrative purposes, those skilled in the art will appreciate that various modifications, additions and substitutions are possible, without departing from the scope and spirit of the invention as disclosed in the accompanying claims.

The invention claimed is:

1. A method for predicting a degree of contamination of molten steel during ladle exchange, the method comprising the steps of:
   providing a first ladle conveying a quantity of molten steel;
   providing a second ladle conveying a quantity of molten steel;
   the first ladle and second ladle each performing an operation to supply the respective quantity of molten steel to a tundish in turn;
   a contamination prediction system, (1) determining a casting quantity (Q), the amount of molten steel transferred from the tundish to a mold at the end of an operation of the first ladle, and determining a residual quantity (Qrm), an amount of molten steel existing in the tundish at the start of the operation of the second ladle; (2) calculating, a first casting amount (Qplug), the casting amount of the molten steel contained in the tundish, when a concentration of contaminants is substantially 0.1, Qplug being determined as a function of Qrm and a first proportional coefficient (g), where g is determined as Qplug/Qrm and has a value between 0.1 and 0.3, and calculating a second casting amount (Qpeak), which is the casting amount of the molten steel contained in the tundish, when a concentration of contaminants is substantially 1, Qpeak being determined as a function of Qrm and a second proportional coefficient (h), where h is determined as Qpeak/Qrm and has a value between 0.2 and 0.4; (3) determining a first preliminary degree of contamination as a linear function of the casting quantity Q, the first casting amount Qplug, and the second casting amount Qpeak, and determining a second preliminary degree of contamination as an exponential function of the casting quantity Q, the first casting amount Qplug, and the second casting amount Qpeak; and (4) obtaining a first degree of contamination at the end of the operation of the first ladle and obtaining a second degree of contamination at the start of the operation of the second ladle by selecting the a smaller of the first preliminary degree of contamination and the second preliminary degree of contamination.

2. The method of claim 1, wherein when the first degree of contamination at the end of the operation of the first ladle is obtained, the first proportional coefficient (g) has a value of 0.1 to 0.2, and the second proportional coefficient (h) has a value of 0.2 to 0.3; when the second degree of contamination at the start of the operation of the second ladle is obtained, the first proportional coefficient (g) has a value of 0.1 to 0.3 and the second proportional coefficient (h) has a value of 0.2 to 0.4.

3. The method of claim 1, wherein, in step (3), the linear function is represented by the following equation 1:

$$\frac{(Q - Q_{plug})}{(Q_{peak} - Q_{plug})}$$ Equation 1 and the exponential function is represented by the following equation 2:

$$\exp\left(-f \cdot \left(\frac{Q}{Q_{rm}} - Q_{peak}\right)\right)$$ Equation 2 wherein f is a third proportional coefficient having a value from 3 to 8.

4. The method of claim 1, further comprising the step of determining a total degree (Tc) of contamination as a function of the first degree of contamination and the second degree of contamination.

5. The method of claim 4, wherein the Tc is calculated by the following equation 3:

$$Tc = A \times C1(1-A) \times C2$$ Equation 3 wherein C1 is the first degree of contamination, C2 is the second degree of contamination, and A is a weight value.

6. The method of claim 5, wherein the weight value (A) has a value from 0.25 to 0.35.

7. The method of claim 1, further comprising, a step of selecting the greater of the selected smaller preliminary degree of contamination and zero to obtain the first preliminary degree of contamination or the second preliminary degree of contamination.

* * * * *